(12) United States Patent
Standing

(10) Patent No.: US 7,088,004 B2
(45) Date of Patent: Aug. 8, 2006

(54) FLIP-CHIP DEVICE HAVING CONDUCTIVE CONNECTORS

(75) Inventor: Martin Standing, Tonbridge (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/307,102

(22) Filed: Nov. 27, 2002

(65) Prior Publication Data
US 2004/0099941 A1 May 27, 2004

(51) Int. Cl.
H01L 23/58 (2006.01)
H01L 23/52 (2006.01)
H01L 29/40 (2006.01)

(52) U.S. Cl. ............ 257/775; 257/737; 257/783
(58) Field of Classification Search ............. 257/762, 257/780, 781, 737, 738, 775, 786, 783; 438/613
See application file for complete search history.

(56) References Cited

U.S. PATENT DOCUMENTS

| 3,561,107 A | | 2/1971 | Best et al. |
|---|---|---|---|
| 3,623,961 A | * | 11/1971 | van Laer ............... 438/614 |
| 3,647,533 A | * | 3/1972 | Hicks ................. 427/96.8 |
| 3,663,184 A | | 5/1972 | Woods et al. |
| 4,078,980 A | * | 3/1978 | Harris et al. |
| 4,182,781 A | * | 1/1980 | Hooper et al. |
| 4,188,438 A | * | 2/1980 | Burns |
| 4,922,322 A | * | 5/1990 | Mathew |
| 5,593,903 A | * | 1/1997 | Beckenbaugh et al. |
| 5,925,930 A | | 7/1999 | Farnworth et al. |
| 6,326,701 B1 | | 12/2001 | Shinogi et al. |
| 6,337,445 B1 | * | 1/2002 | Abbott et al. |

FOREIGN PATENT DOCUMENTS

WO    WO 01/75961 A1  *  10/2001

* cited by examiner

Primary Examiner—S. V. Clark
(74) Attorney, Agent, or Firm—Ostrolenk, Faber, Gerb & Soffen, LLP

(57) ABSTRACT

Semiconductor devices having a passivation layer formed over their major electrodes and individual electrical connectors connected to the electrodes by conductive attach material through openings in the passivation layer are described.

25 Claims, 5 Drawing Sheets

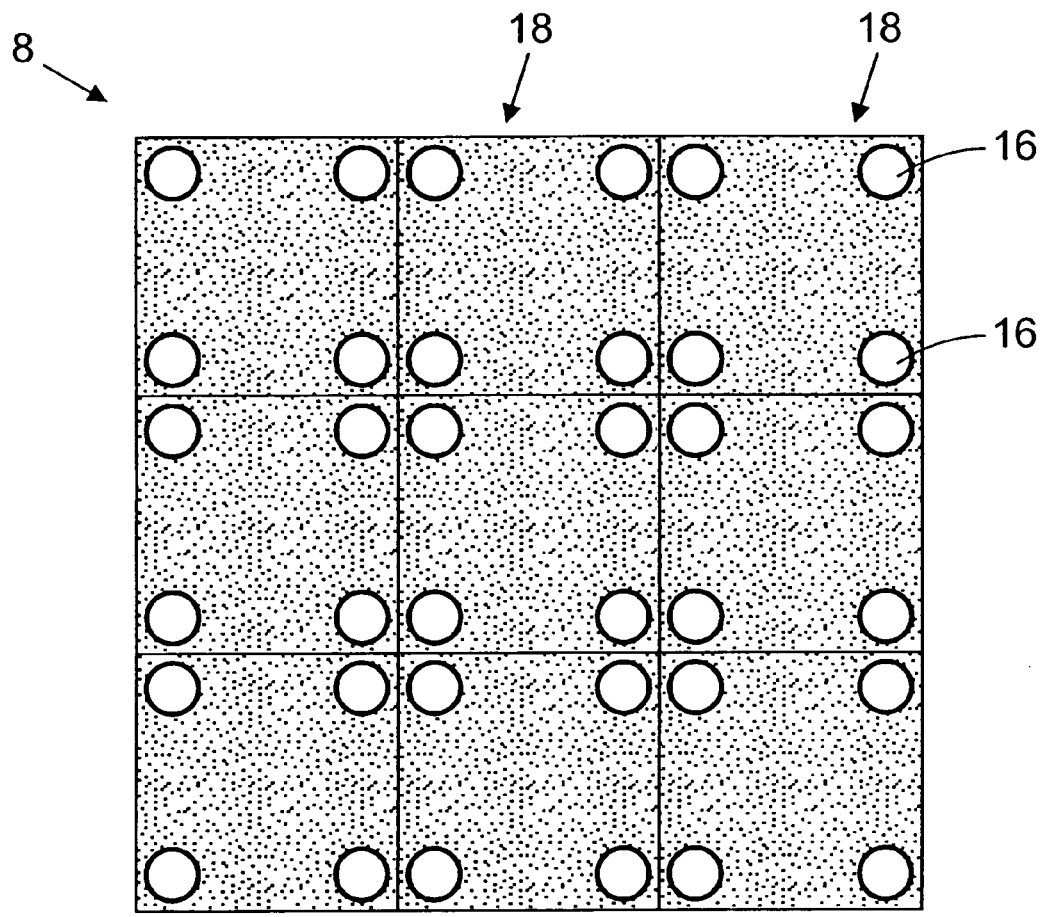
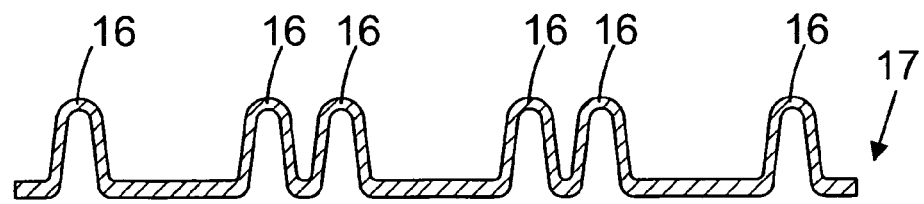
Figure 5

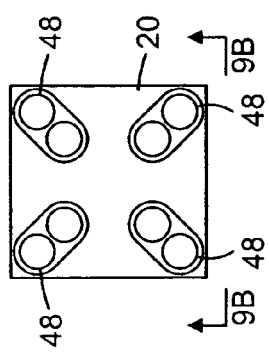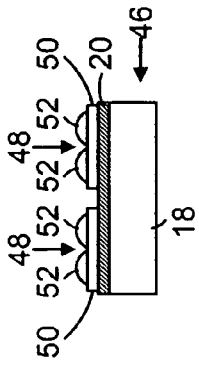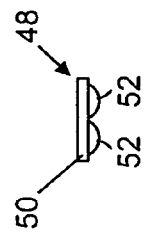
Figure 9A  Figure 9B  Figure 9C
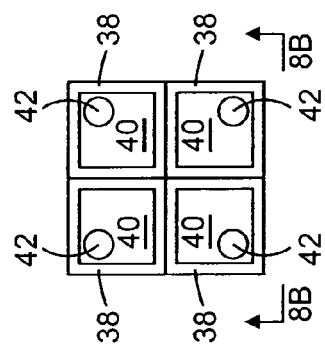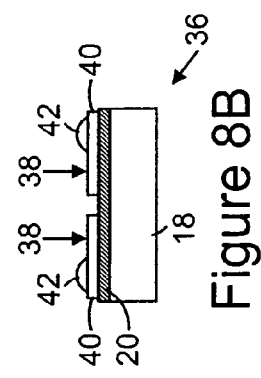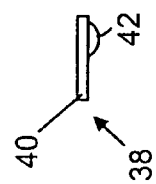
Figure 8A  Figure 8B  Figure 8C
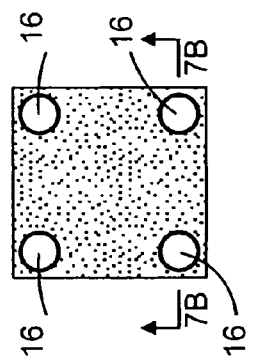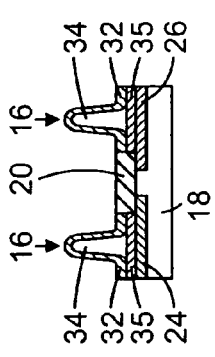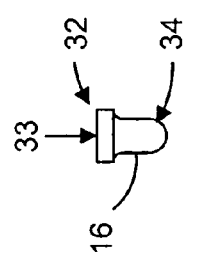
Figure 7A  Figure 7B  Figure 7C

FLIP-CHIP DEVICE HAVING CONDUCTIVE CONNECTORS

BACKGROUND OF THE INVENTION

The present invention relates to semiconductor devices and more particularly to chip-scale flip-chip devices.

Because of their relatively small size chip-scale semiconductor devices have been used to increase the density of parts in an electronic circuit and/or reduce the size of an electronic circuit. Some chip-scale semiconductor device have a footprint which is the size of the die or nearly the size of the die. One way to obtain such a small footprint is to place all of the major electrodes on one of the major surfaces of the die. International Patent Application WO 01/59842 A1, entitled Vertical Conduction Flip-Chip Device with Bump Contacts on Single Surface, which is assigned to the assignee of the present invention, discloses a chip-scale flip-chip device which includes a die that has all its major electrodes disposed on one major surface thereof and is electrically mountable on a substrate via solder balls formed on its major electrodes. The device shown in WO 01/59841 A1 has a reduced footprint because its solder balls are positioned directly under the die when it is mounted thus making it possible to limit the size of the device to the size of the chip.

International Patent Application WO 01/75961, entitled Chip Scale Surface Mounted Device and Process of Manufacture, which is assigned to the assignee of the present application, shows a semiconductor device which has a semiconductor power MOSFET having two major electrodes on a first major surface thereof and another major electrode on a second major surface thereof. A passivation layer having a plurality of openings is disposed over the major electrodes on the first major surface of the MOSFET. The openings in the passivation layer are made through to a solderable top metal or a solderable surface can be formed over the exposed portions of the electrodes by nickel plating, gold flash or other series of metals so that solder may be received by the electrodes. In the device shown by WO 01/75961, the passivation layer acts as a plating resist, and a solder mask, designating and shaping the solder areas, as well as acting as a conventional passivation layer. The device shown in WO 01/75961 has a footprint that is close to the size of the chip because the connections to two of its three major electrodes are positioned directly under the power MOSFET.

SUMMARY OF THE INVENTION

A semiconductor device according to the present invention is a chip-scale flip-chip having connectors that contribute to the improvement of electrical and thermal characteristics and reliability of the device over conventional flip-chips.

A semiconductor device according to the present invention may be a flip-chip device having a semiconductor die which has all of its major electrodes disposed on one major surface thereof A passivation layer is disposed over all of the electrodes, and openings are created in the passivation layer to expose a portion of each major electrode. Individual electrical connectors, each having a base portion and a contact portion, are electrically connected at their base portions by a conductive attach material to the exposed portions of the electrodes. The passivation layer defines the areas of the electrode to which connectors are connected, as well as providing protection for the termination structure of the device.

The electrical connectors used in the semiconductor devices according to the present invention are preformed out of a sheet of conductive metal such as copper by, for example, punching. The shape of the base of the connectors may be changed as desired to enhance the strength of the connection between the connectors and the electrodes of the semiconductor die and/or maximize the area of passivation between the connectors. For example, the shape of the base of the electrodes may be circular, rectangular or oval.

The openings in the passivation layer according to the present invention may correspond to the shape and size of the base of the electrical connectors to conserve as much of the passivation layer as possible. Also, the number of contact portions on each base portion may be increased as desired to reduce contact resistance between the device and electrical pads of a substrate.

A semiconductor device according to the present invention is manufactured by first providing a wafer having a plurality of semiconductor die formed thereon. Each semiconductor die on the wafer is then provided with solderable major electrodes. By using solderable electrodes the need for under bump metallization is eliminated.

Preferably, all of the major electrodes of the die are provided on the same surface. A photo imageable epoxy is then deposited over the entire surface of the wafer, covering the electrodes of all the semiconductor die. The epoxy is then dried, and openings are formed over the major electrodes of each die by, for example, application of ultraviolet light through a mask and removal of the affected areas in the dried epoxy. Each opening exposes a portion of the surface of an electrode. Attach material such as solder or conductive epoxy is deposited on the exposed portions of the electrode through each opening followed by placement of electrical connectors in each opening. Thereafter, if conductive epoxy is used as attach material, it is cured, and if solder is used, it is reflowed. The wafer is then diced into individual chip-scale semiconductor devices.

The semiconductor devices so manufactured have higher electrical and thermal performance and are more reliable. The manufacturing cost of the semiconductor devices is also less than conventional flip-chips. Also, using the technique described herein a semiconductor device with a much larger die area than the conventional devices can be obtained.

Other features and advantages of the present invention will become apparent from the following description of the invention which refers to the accompanying drawings.

BRIEF DESCRIPTION OF THE DRAWINGS

FIG. 5 shows a cross-sectional profile view of a copper strip from which copper connectors are punched out and used in the device according to the first embodiment of the invention.

FIG. 6 shows the wafer of FIG. 4 having copper connectors connected to the electrodes of the semiconductor die through the openings in the passivation layer in accordance with the invention.

FIG. 7A shows a bottom view of a singulated semiconductor device according to the first embodiment of the present invention.

FIG. 7B is a cross-sectional view of a semiconductor device according to the first embodiment looking in the direction of line 7B—7B in FIG. 7A.

FIG. 7C shows an electrical connector used in the first embodiment of the present invention.

FIG. 8A shows a bottom view of a semiconductor device according to the second embodiment of the present invention.

FIG. 8B is a side view of the semiconductor device shown in FIG. 8A looking in the direction of line 8B—8B in FIG. 8A.

FIG. 8C shows a side view of an electrical connector used in the second embodiment of the present invention.

FIG. 9A shows a bottom view of a semiconductor device according to the third embodiment of the present invention.

FIG. 9B is a side view of the semiconductor device shown in FIG. 9A looking in the direction of line 9B—9B in FIG. 9A.

FIG. 9C shows a side view of an electrical connector used in the third embodiment of the present invention.

DETAILED DESCRIPTION OF EMBODIMENTS OF THE INVENTION

Figure 1:
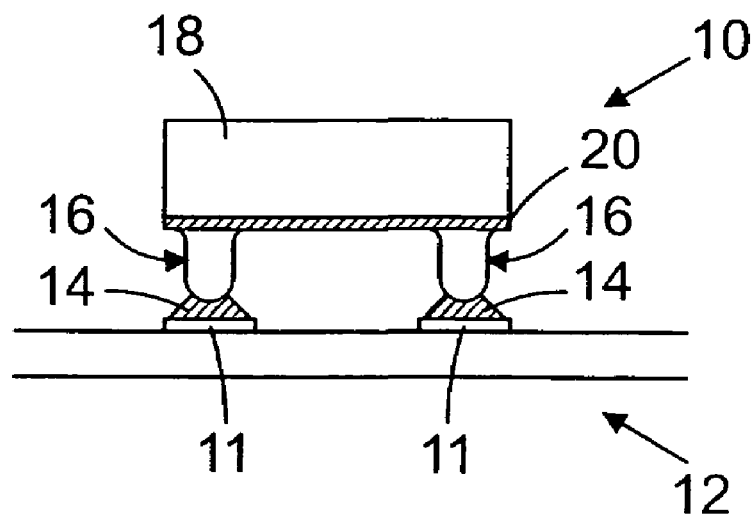
FIG. 1 shows a side view of a semiconductor device according to the first embodiment connected to electrical pads on a substrate.

FIG. 1 shows semiconductor device 10 according to the first embodiment of the invention surface-mounted on conductive pads 11 of substrate 12 by layers of conductive material 14, such as solder or conductive epoxy. Substrate 12 may be an ordinary circuit board or an insulated metal substrate. Conductive pads 11 may be connected to other elements on the substrate 12 via copper traces (not shown) to form an electronic circuit.

Semiconductor device 10 according to the first embodiment includes a plurality of electrical connectors 16. Each electrical connector 16 is connected to a respective major electrode disposed on a major surface of semiconductor die 18. Passivation layer 20 is disposed over the electrodes 22, 24, 26 (FIG. 2) of semiconductor die 18 and around each electrical connector 16.

Semiconductor device 10 according to the first embodiment is a flip-chip semiconductor device. This type of semiconductor device is surface-mounted on a substrate via connections that extend from only one of its major surfaces.

Figure 2:
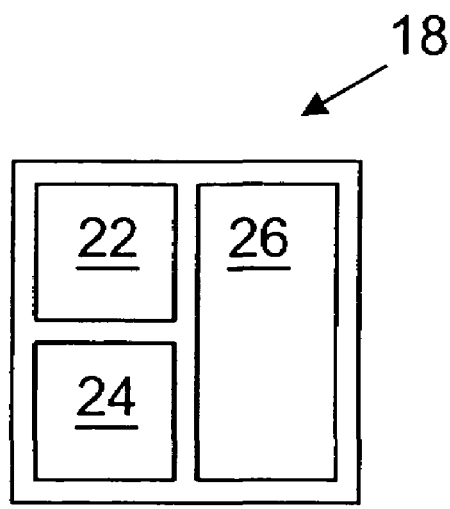
FIG. 2 is a plan top view of a semiconductor die having all major electrodes on one surface.

Referring now to FIG. 2, semiconductor device 10 in a preferred embodiment of the present invention includes a semiconductor die 18 having disposed on only one major surface thereof control electrode 22 which receives signals that control the operation of die 18, first terminal electrode 24 and second terminal 26. Electrodes 22, 24, 26 are formed with a solderable metal such as: (a) titanium/tungsten, nickel, silver or (b) titanium/tungsten, aluminum, titanium, nickel, silver.

In this embodiment, semiconductor die 18 may be a MOSFET having a gate electrode which corresponds to control electrode 22, a source electrode which corresponds to first terminal electrode 24 and a drain electrode 26 which corresponds to second terminal electrode 26. It is to be understood that the present invention is not limited to MOSFETs, and that other semiconductor dies, namely, IGBTs, power diodes, and the like may be equally used to practice the present invention.

Figure 3:
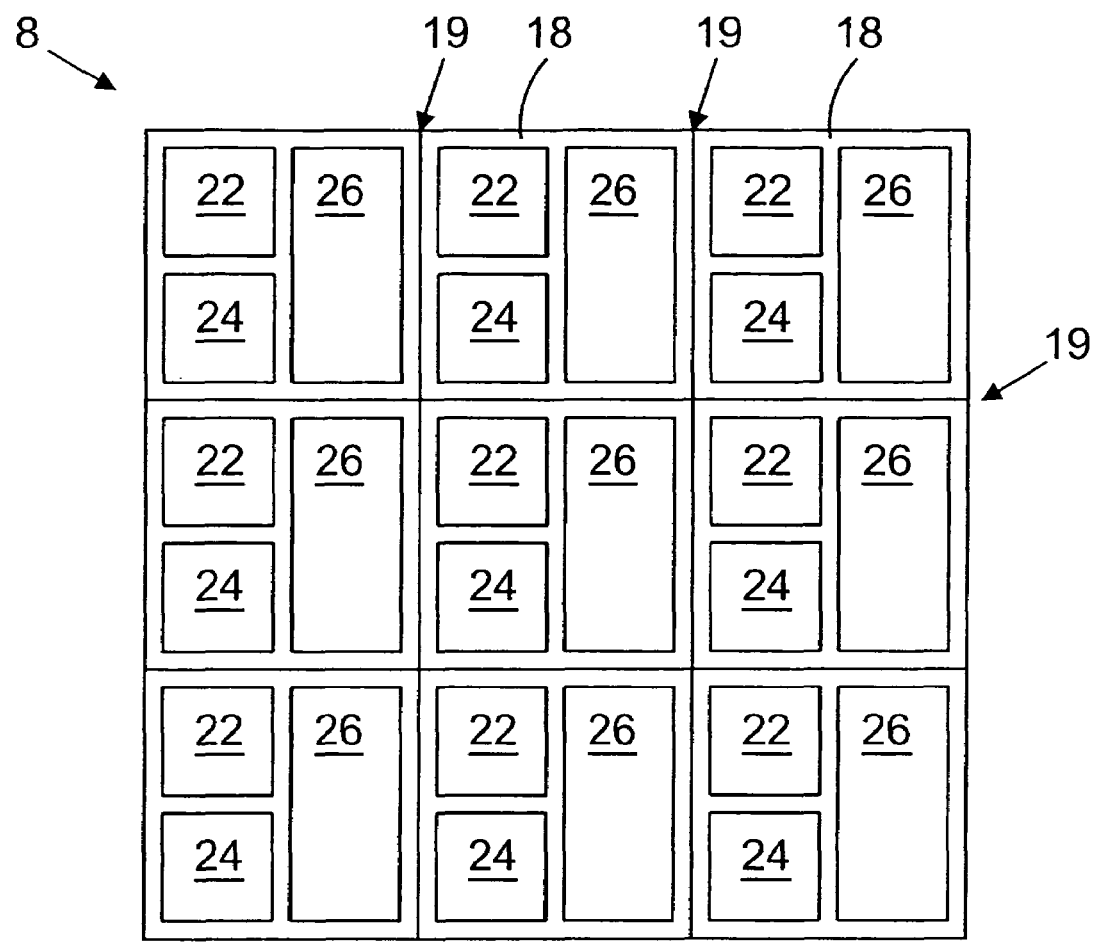
FIG. 3 shows a wafer having a plurality of semiconductor die shown in FIG. 2 before singulation.
Figure 4:
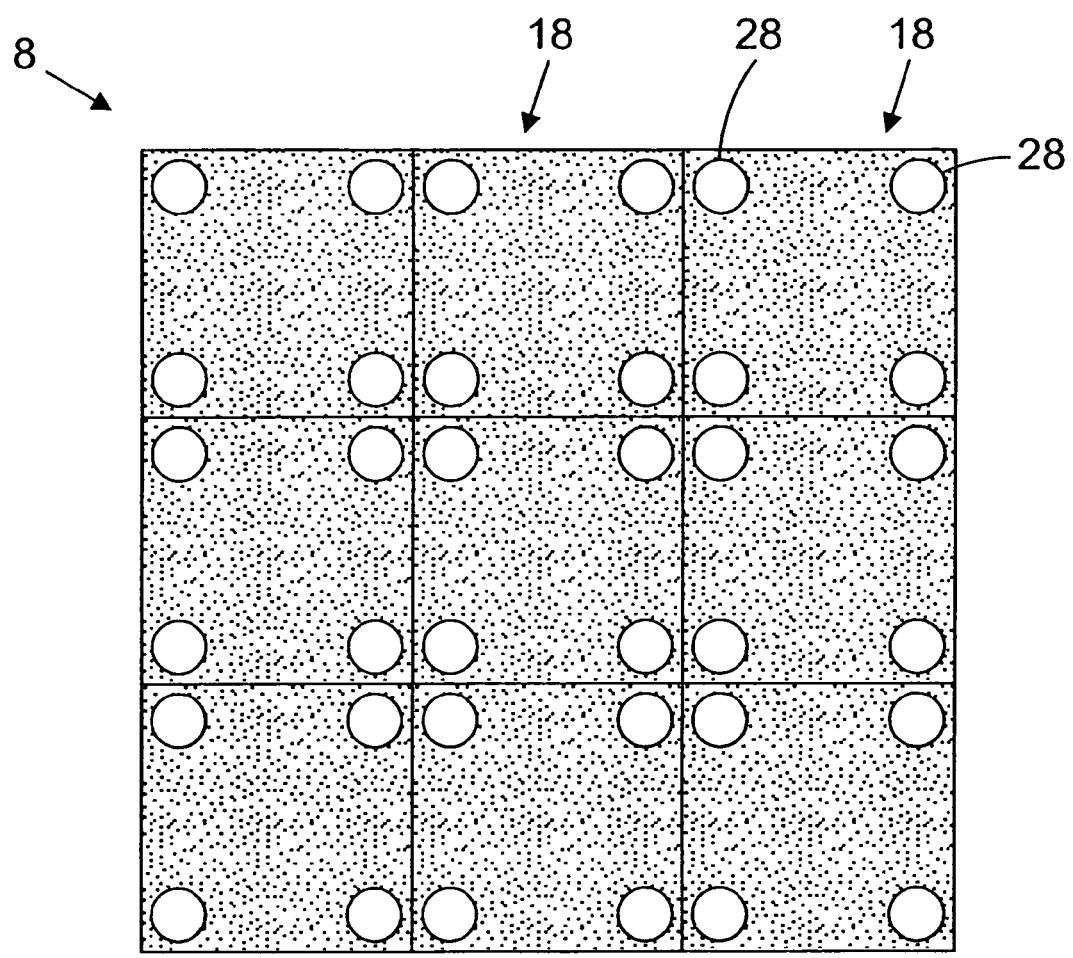
FIG. 4 shows the wafer of FIG. 3 having disposed thereon a passivation layer with openings to expose portions of electrodes of the semiconductor die.

Referring to FIG. 3, to make semiconductor device 10, silicon wafer 8 having a plurality of semiconductor dies 18 is provided. Each semiconductor die 18 in wafer 8 has disposed on a major surface thereof electrodes 22, 24, 26 as shown in FIG. 2. Streets 19 in wafer 8 separate semiconductor die 18 from one another. Wafer 8 is then covered by a photosensitive liquid epoxy by, for example, screen printing so that electrodes 22, 24, 26 of each semiconductor die 18 is covered. The photosensitive liquid epoxy should be a photo imageable material such as the material commercially known as "EP2793". After coating the wafer with the photosensitive liquid epoxy, the epoxy is dried and ultraviolet light is applied to the epoxy layer through a mask to define predesignated areas over each electrode 22, 24, 26 of each semiconductor die 18 in the wafer 8. These designated areas are then removed to create openings 28 in the epoxy layer to expose portions of electrodes 22, 24, 26 of each semiconductor die 18 in wafer 8 as shown in FIG. 4. The epoxy may then be cured to form a passivation layer 20. Of course, other methods for depositing passivation layer 20 on electrodes 22, 24, 26 of semiconductor die 18 may be used instead of the one described above.

Once openings 28 have been created, wafer 8 is held in place on a vacuum chuck and aligned using preferably optical alignment, which is a technique used in die bonding. After alignment, conductive attach material 35 such as solder paste or epoxy is deposited on the exposed surfaces of electrodes 22, 24, 26 of die 18 through each opening 28. Thereafter, preformed electrical connectors, e.g. connectors 16, are placed on the conductive attach material 35 as shown in FIG. 6. Preferably, electrical connectors 16 used in the semiconductor devices of the present invention are punched out of a strip of copper 17 (FIG. 5) and placed in the openings in the passivation layer 20 by a vacuum transport arm. Preferably, multiple electrical connectors 16 are placed in respective openings in one operation.

Referring to FIGS. 7A–7C, electrical connector 16 includes a base portion 32 which has a contact surface 33 and contact portion 34 which makes electrical contact with a corresponding conductive pad 11 on a substrate 12 as shown in FIG. 1. Each electrical connector 16 is placed in an opening 28 so that its base portion 32 is connected to a respective electrode 22, 24, 26 of a semiconductor die 18 by attach material 35 that is deposited through openings 28. Thereafter, if conductive epoxy is used as attach material 35 it is cured, and if solder is used it is reflown. Optionally, a high strength thermal epoxy may be deposited over the wafer to cover at least a portion of base portion 32 of connectors 16 to improve the strength of the connection between connectors 16 and respective electrodes 22, 24, 26. Then, wafer 8 is diced along streets 19 to produce chip-scale flip-chip semiconductor devices 10 according to the first embodiment of the present invention.

Alternatively, wafer 8 shown in FIG. 4 may be diced to produce individual semiconductor die 18 each having a passivation layer 20 and openings 28 formed in passivation layer 20 over its major electrodes 22, 24, 26. Connectors 16 may then be placed over conductive attach material deposited on exposed surfaces of electrodes 22, 24, 26 through openings 28. Thereafter, if solder is used as conductive attach material 35 it is reflown and if a conductive epoxy is used it is cured to obtain semiconductor device 10 according to the first embodiment of the present invention as shown in FIGS. 7A and 7B.

According to an aspect of the present invention, the area and the shape of the openings can be made to approximately correspond to the size and shape of the base portions of the connectors used so that the passivation layer may retain its maximum area of coverage. According to another aspect of the present invention the base portion of a connector may be enlarged so that a better and more stable connection can be made between the connector and the electrode of the die. For example, portion 32 of electrical connector 16 has a diameter that is larger than its contact portion 34. The comparatively larger diameter of base portion 32 allows for more stability when connector 16 is connected to an electrode of die 18.

Also, a base portion having a larger area may be able to accommodate more than one contact portion, thereby reducing the resistance of the connector. Referring to FIGS. 8A–8C, for example, semiconductor device 36 according to a second embodiment of the present invention includes connectors 38 each having base 40 and contact portion 42 for making electrical contact with an electrical pad on a substrate such as pad 11 on substrate 12 as shown in FIG. 1. Electrical connectors 38 have a rectangular base 40 which fits within a corresponding rectangular opening 44 in passivation layer 20.

Referring to FIGS. 9A–9C, semiconductor device 46 according to the third embodiment of the present invention includes electrical connectors 48 each having base 50 and two contact portions 52 for making electrical contact with an electrical pad on a substrate such as pad 11 on substrate 12 as shown in FIG. 1. Electrical connectors 48 have oval shaped bases 50 which fit within corresponding oval openings 54 in passivation layer 20.

According to an aspect of the invention, whenever the base portion of a connector is enlarged, a conductive epoxy may be used instead of solder to connect the connector to an electrode of the die. Thus, for example, in the first embodiment of the present invention solder is preferred for connecting connector 16 to an electrode of die 18, while conductive epoxy may be used as attach material in the second and third embodiments given the enlarged area of their respective connectors.

A semiconductor device according to the present invention exhibits improved electrical and thermal properties, as well as, better reliability over conventional flip-chips. In addition, the process used for making semiconductor devices according to the present invention eliminates the need for under-bump metallization which may be required for the production of conventional flip-chips.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor device comprising:
   a semiconductor die having at least one electrode disposed on a major surface thereof;
   a passivation layer disposed over said at least one electrode of said semiconductor die;
   an opening in said passivation layer extending from the top surface of said passivation layer to said at least one electrode; and
   a preform non-spherical copper electrical connector including a base portion having a selectable shape and a contact portion for making electrical contact with an external element;
   wherein said base portion of said electrical connector is electrically and mechanically connected to said at least one electrode of said semiconductor die by a layer of conductive adhesive material disposed within said opening, said conductive adhesive material being either solder or conductive epoxy, and wherein said shape of said base portion is configured to maximize the area of said passivation, and said opening is selectable to correspond to said shape of said base portion.

2. The semiconductor device of claim 1 wherein said contact portion is a raised bump.

3. The semiconductor device of claim 1 wherein said base portion is rectangular.

4. The semiconductor device of claim 1 wherein said base portion is circular.

5. The semiconductor device of claim 1 wherein said base portion is oval.

6. The semiconductor device of claim 1 wherein said opening has a shape corresponding to the shape of said base portion.

7. The semiconductor device of claim 1 wherein said base portion and said contact portion form a unitary body.

8. The semiconductor device of claim 1 wherein said copper electrical connector is punched out of a sheet of copper.

9. The semiconductor device of claim 1 wherein said at least one electrode is solderable.

10. The semiconductor device of claim 1 wherein said semiconductor die is a MOSFET having at least a source electrode, a gate electrode, and a drain electrode each being a major electrode.

11. A chip-scale semiconductor device comprising:
    a semiconductor die having all major electrodes residing on one major surface thereof;
    a passivation layer disposed over said major surface;
    at least one opening in said passivation layer for each one of said major electrodes, each opening exposing a portion of the top surface of a major electrode; and
    a plurality of preformed non-spherical copper electrical connectors each having a base portion and a contact portion, each base portion having a selectable shape;
    wherein said exposed portion of said top surface of each major electrode is electrically and mechanically connected to said base portion of at least one of said plurality of electrical connectors by a layer of conductive adhesive material, said conductive adhesive material being either solder or conductive epoxy, and wherein said shape of each said base portion is configured to maximize the area or said passivation between said connectors and each said opening is selectable to correspond to a shape of a respective base portion.

12. The semiconductor device of claim 11 wherein said semiconductor die is a MOSFET having a drain electrode, a gate electrode and a source electrode as major electrodes.

13. The semiconductor device of claim 11 wherein said contact portion is a bump.

14. The semiconductor device of claim 11 wherein said base portion is rectangular.

15. The semiconductor device of claim 11 wherein said base portion is circular.

16. The semiconductor device of claim 11 wherein said base portion is oval.

17. The semiconductor device of claim 11 wherein said at least one opening for each one of said major electrodes has a shape generally corresponding to the shape of said base portion of a corresponding electrical connector.

18. The semiconductor device of claim 11 wherein said base portion and said contact portion form a unitary body.

19. The semiconductor device of claim 11 wherein said electrical connectors are punched out of a sheet of copper.

20. A process for manufacturing a semiconductor device comprising:
   providing a semiconductor wafer having a plurality of semiconductor dies formed thereon;
   forming solderable electrodes on a major surface of each of said semiconductor dies;
   forming a passivation layer over said electrodes, and at least one opening in said passivation layer over each electrode to expose a portion of said electrode;
   depositing a layer of conductive adhesive material in said openings over said exposed portions;
   preforming a plurality of non-spherical electrical connectors each connector including a base portion having a selectable shape;
   placing an electrical connector on each said layer of conductive adhesive material; and
   dicing said wafer into individual semiconductor die;
   wherein said shape of each said base portion is configured to maximize the area of said passivation between said connectors and each said opening is selectable to correspond to a shape of a respective base portion.

21. The process of claim 20 wherein said solderable electrodes comprise one of a combination of titanium or tungsten, nickel, silver and a combination of titanium or tungsten, aluminum, titanium, nickel, silver.

22. The process of claim 20, wherein said conductive adhesive material is solder, and said process further comprises reflowing said solder before dicing said wafer.

23. The process of claim 20, wherein said conductive adhesive material is a conductive epoxy and said process further comprises curing said conductive epoxy before dicing said wafer.

24. The process of claim 20, wherein said electrical connector is preformed from a sheet of copper by punching.

25. A process for manufacturing a semiconductor device comprising:
   providing a semiconductor wafer having a plurality of semiconductor dies formed thereon;
   forming solderable electrodes on a major surface of each of said semiconductor dies;
   forming a passivation layer over said electrodes, and at least one opening in said passivation layer over each electrode to expose a portion of said electrode;
   depositing a layer of conductive adhesive material on said exposed portions;
   placing an a non-spherical electrical connector on each said layer of conductive adhesive material, each connector including a base portion having a selectable shape configured to maximize the area of said passivation between said connectors;
   dicing said wafer into individual semiconductor die; and
   depositing a thermal epoxy over said passivation layer and portions of said electrical connectors to further strengthen the connection between said electrical connectors and said semiconductor die;
   wherein each opening is selectable to correspond to a shape of a respective base portion.

* * * * *